United States Patent [19]

Hoover et al.

[11] Patent Number: 4,555,414

[45] Date of Patent: Nov. 26, 1985

[54] PROCESS FOR PRODUCING COMPOSITE PRODUCT HAVING PATTERNED METAL LAYER

[75] Inventors: Merwin F. Hoover, Topsfield; Ann B. Salamone, Marblehead; Jan Vandebult, Topsfield, all of Mass.

[73] Assignee: Polyonics Corporation, Newburyport, Mass.

[21] Appl. No.: 485,328

[22] Filed: Apr. 15, 1983

[51] Int. Cl.[4] ............................................. B05D 3/06
[52] U.S. Cl. ................................. 427/43.1; 427/54.1; 427/98; 430/417
[58] Field of Search ............... 430/315, 414, 417; 427/43.1, 44, 54.1, 98

[56] References Cited

U.S. PATENT DOCUMENTS

| | | | |
|---|---|---|---|
| 3,600,330 | 8/1971 | Schneble et al. | 252/430 |
| 3,775,176 | 11/1973 | Cross et al. | 117/227 |
| 3,779,758 | 12/1973 | Polichette | 430/315 |
| 3,863,244 | 1/1975 | Lichtblau | 340/280 |
| 3,900,320 | 8/1975 | Rolker et al. | 96/35.1 |
| 3,907,621 | 9/1975 | Polichette et al. | 430/414 |
| 3,925,578 | 12/1975 | Polichette et al. | 427/304 |
| 3,967,161 | 6/1976 | Lichtblau | 317/101 R |
| 4,006,047 | 2/1977 | Brummett et al. | 156/656 |
| 4,021,705 | 5/1977 | Lichtblau | 361/402 |
| 4,073,981 | 4/1978 | Baron | 427/259 |
| 4,077,853 | 3/1978 | Coll-Palagos | 204/20 |
| 4,089,993 | 5/1978 | Shirahata et al. | 427/129 |
| 4,100,037 | 7/1978 | Baron et al. | 204/15 |
| 4,133,908 | 1/1979 | Madsen | 427/53 |
| 4,167,601 | 9/1979 | Beckenbaugh et al. | 428/209 |
| 4,181,750 | 1/1980 | Beckenbaugh et al. | 430/414 |
| 4,192,764 | 3/1980 | Madsen | 430/455 |
| 4,216,246 | 8/1980 | Iwasaki et al. | 427/43.1 |
| 4,234,628 | 11/1980 | DuRose | 427/305 |
| 4,268,536 | 5/1981 | Beckenbaugh et al. | 427/54.1 |
| 4,369,557 | 1/1983 | Vandebult | 29/25.42 |

*Primary Examiner*—John H. Newsome
*Attorney, Agent, or Firm*—Paul J. Cook

[57] ABSTRACT

A multilayered composite product including a base, a patterned cured resin bonded to the base and an applied metal layer selectively bonded to the patterned cured resin. The product is useful as an electrical circuit.

29 Claims, 8 Drawing Figures

PROCESS FOR PRODUCING COMPOSITE PRODUCT HAVING PATTERNED METAL LAYER

BACKGROUND OF THE INVENTION

This invention relates to an article of manufacture having selective metal pathways and to a process for making the product wherein the metal pathways can function as an electrically conductive circuit.

Prior to the present invention, a wide variety of processes has been available for forming electrically conductive pathways on a non-electrically conducting substrate. For example, a metal film such as a film formed from copper can be applied to a non-conducting substrate to form a resultant laminate in a first step. Typical substrates include rigid composites of fiber glass and polyester or fiber glass and epoxy or plastic films of solvent resistant polyester or polyimide. In a commonly employed process, a layer of conductive metal such as copper is laminated to the non-conductive substrate in a first step. A photoactivatible polymer (photoresist) then is coated on the metal layer and is subsequantly exposed to a light pattern using a light mask to reproduce the original metal pathway pattern desired followed by photoresist development and then metal etching in the area unprotected by the resist, thereby to produce the desired pattern. Alternatively, an etch resist can be directly printed such as by silk screen, gravure or the like on the metal laminate sheet followed by curing and then metal etching. This multistep process is slow and time-consuming and utilizes an expensive metal laminated substrate such as a copper laminated substrate.

An alternative presently available process comprises direct circuit printing on a substrate utilizing a conductive metal-filled thick film ink or printing paste. In these processes, the conductive inks are limited to either very expensive silver or gold precious metals since they have the requisite high conductivity combined with resistance to oxidation. Attempts to utilize these conductive inks with less expensive nickel, copper or aluminum powder, for example, have proven to be unsatisfactory for many applications since these metals, in the form of fine powders, do not provide the requisite conductivity primarily due to surface oxidation. The less expensive and highly conductive copper metal cannot be used in such a direct printing metal ink due to the rapid surface oxidation of the copper when in the form of fine powder such as irregular particles, spheres or flakes. Thus, this process is not amenable to manufacturing economical high conducting copper circuitry patterns.

In other processes, coatings containing noble or non-noble metals or metal salts dispersed as particles, usually in a polymeric binder, function as seed sites for subsequent plating with a metal. The polymeric composition containing the metal or metal salt is applied to a substrate in the desired pattern. After being applied or printed, the composition is heat cured in order to drive off solvent and to cross-link the polymer. The high temperatures, e.g. 160° C., and extended cure times, e.g. 1-2 hours, required for these products limits their use to products having good high temperature stability where the products are made by batch processes. Palladium is a typical activating material and is an expensive raw material that is only partially utilized since only the surface metal and the metal immediately adjacent to the surface is actually used to initiate plating. All the remaining buried metal is not utilized and therefore constitutes an unnecessary expense. In addition to this expense of overburden for metal filling, the availability and cost of precious/semiprecious material is volatile. Furthermore, printed lines only about 5 mils or greater are possible so that electrically conductive circuitry produced thereby is highly limited. Typical examples of these processes are disclosed, for example, in U.S. Pat. Nos. 3,900,320, 3,775,176 and 3,600,330.

It has also been proposed to form electrically conductive metal pathways by a process which includes coating a substrate with a composition containing a reducible metal complex. In one such process, a substrate is coated with a sorbitol copper formate solution containing a photoactivated reducing agent. Upon exposure to ultraviolet radiation, unmasked areas are reduced to copper metal and are suitable for plating nucleation sites. Non-exposed areas are washed clean and all copper formate is removed before plating can be carried out. Although the photo-reducible copper solution is readily applied and selectively ultraviolet radiation treated, plating selectivity becomes a severe problem due to the high incidence of copper formate remaining on non-desired areas of the substrate. This results in a low reliability of the photo-selective copper reduction process. Examples of this technology are set forth in U.S. Pat. Nos. 4,268,536, 4,181,750, 4,133,908, 4,192,764, 4,167,601 and 3,925,578.

It has also been proposed to apply to a substrate non-metal containing coatings which are subsequently activated for plating by surface treatment with noble and/or non-noble metals or metal salts. Typical examples of these processes are shown in U.S. Pat. Nos. 4,089,993, 4,073,981, 4,100,037 and 4,006,047. All of the coated substrates are heat cured and require elevated temperatures for long cure times. Because of the use of palladium, the cost of plating is relatively high. Examples of utilizing non-noble metals such as copper, nickel or cobalt are shown in U.S. Pat. Nos. 4,006,047, 4,077,853 and 4,234,628. These systems all require the interaction of at least two non-noble metals for rendering a surface receptive to plating and are limited to complete plating coverage of an article and are not utilized in selective printing and plating to form electrically conductive pathways.

The above-described plating art is utilized primarily to form electrical conducting metal pathways which function as electrical circuits in a wide variety of applications such as printed circuit boards using a relatively rigid base or so-called flexcircuits using a flexible plastic base where the circuit is sandwiched between two layers of flexible plastic. Typical bases for printed circuit boards include epoxy-fiber glass composites or phenolic-fiber glass composites. Typical bases for flexcircuits include solvent-resistant polyimides and polyester. The polyimides, which are also high temperature stable, are very expensive. In forming such flexcircuits, the copper is laminated to the flexible polymer base, and then selectively etched to form the desired circuit. The printed circuit boards now utilized can be single sided, double sided or multilayer wherein electrically conductive paths are sandwiched between dielectric layers. The dielectric layer can be the rigid or flexible substrate or a resist. Thus, in known subtractive processes, the polymer base must be capable of withstanding the etching composition so that it is not degraded during circuit formation.

The above-described plating processes also can be utilized to form thin flexible resonant circuits which are useful for electronic security and article theft detection systems. While these circuits are electrically conductive, in use they are passive in that they are not used primarily as current carrying devices. Article theft detection systems are known in which electromagnetic waves are generated at a checkpoint and are caused to sweep repetitively at a given rate through a predetermined frequency range. A resonant electrical circuit tag is affixed to articles to be protected, the electrical circuit being resonant at a frequency within the swept frequency range. Changes in energy level which occur at a specific frequency within the swept repeating frequency band are detected, indicating presence of the tag in the field. The electrical circuit comprises a coil and a capacitor connected to form a resonant loop. The tag circuit comprises an insulative substrate having one portion of the circuit formed on the opposite side of the substrate. Electrical connection is made between the portions of the circuit on opposite sides of the substrate by means of a conductive pin or eyelet extending through the substrate, or by means of a spot weld joining confronting circuit areas as disclosed, for example, by U.S. Pat. Nos. 3,863,244, 3,967,161, 4,021,705 and 4,369,557.

It would be highly desirable to provide a simpler, less costly and more rapid process for forming electrically conductive pathways on any one of a variety of non-conducting substrates. Furthermore, it would be desirable to provide such a process which eliminates the need for any metal etching step and which does not require the use of high temperatures or extensive curing time. By providing such a process, a wide variety of substrates, including thin film substrates or rigid substrates could be utilized to support electrically conductive paths. Such composite products could be utilized to produce metallized patterns such as those utilized on printed circuit boards, multilayer boards, electronic article surveillance circuit constructions utilized in article theft detection systems, decorative articles or the like.

SUMMARY OF THE INVENTION

In accordance with this invention, a composite article is provided comprising a base, a patterned cured resin bonded to the base and a metal layer bonded to the surface of the patterned cured resin to form patterned metal pathways. The metal pathways can be utilized to carry electrical current or can be utilized in a passive mode such as to form a resonant electrical circuit in response to electromagnetic waves at a given frequency such as in article theft detection devices, or can be merely decorative. The curable resin is coated on the substrate in the form of the desired pattern. It is then treated to activate the surface as by physically and/or chemically modifying the surface. The surface is then contacted with a catalytic metal composition capable of subsequently catalyzing the electroless deposition of metal on the patterned cured resin. The electrolessly deposited metal can, in turn, be coated with subsequent layers of metal, either electrolessly or electrolytically deposited. Composite articles having alternating multiple layers of metal and non-metal can be formed by the process of this invention.

DESCRIPTION OF SPECIFIC EMBODIMENTS

In accordance with this invention, a curable resin composition is bonded to a substrate in the form of a pattern which pattern is the same as the final desired metal pattern on the substrate. The curable resin composition must have suitable rheology to ensure retention of the printed pattern between the time of printing and subsequent curing, as for example, by being exposed to ultraviolet radiation, X-ray radiation, electron beam, heat or the like. The particular means for effecting curing is chosen so that the substrate is not damaged. For example, when the substrate is a polymeric film, it is preferred to employ ultraviolet radiation as a curing means and to avoid heating so that the film is not damaged.

Once exposed to radiation or heat, the cured printed resin is selectively etched to modify a portion of the surface rendering it receptive to catalytic metal deposition. The etched resin is contacted with a composition containing a catalytic metal or metal salt capable of subsequently catalyzing electroless deposition of the metal coating. If necessary, the adsorbed metal catalyst is reduced and then the pattern rinsed. After these steps are completed, the cured patterned resin has been physically and chemically modified selectively so that electroless deposition of metal thereon is effected selectively without effecting deposition on the substrate. Further electroless or electrolytic plating can be used depending on end-use application.

Any flexible or rigid substrate can be utilized in the process of this invention. Typical film or relatively rigid substrates include polymeric compositions containing polyamide, polycarbonate, polyester, polyetherimide, polyimide, polynitrocellulose, polyolefins such as polyethylene, polypropylene, poly(ethylenevinylacetate), poly-2-pentene, EPDM, polyionomers such as Surlyn ®, polyphenylene oxide, polyphenylene sulfide, polysulfone, polystyrene, polyvinyl-vinylidine chloride or fluoride or the like. The preferred flexible substrates include polycarbonates, polyesters, polyetherimides, polyimide, polyolefins or polysulfone. Particularly for the flexible printed circuit industry, substrates such as polyimides (KAPTON ®), polyesters (Mylar ®) polycarbonates (Lexan ®) and polyetherimides (Ultem ®) preferred due to their physical, electrical and thermal stability over wide temperature ranges, chemical inertness and radiation resistance. For decorative uses, polyolefins and other less expensive substrates are preferred where temperature and other stress requirements are less. Alternatively, rigid substrates can include ceramics, glass, plastics, paper compositions or the like; or composite substrates such as epoxy-fiber glass, epoxy-paper laminate, paper-fiber glass laminate, urea formaldehyde-fiber glass laminate, phenolic-fiber glass laminate, a polymeric flurocarbon-fiber glass laminate, or the like or with other reinforcing components such as carbon fiber, synthetic polymer fiber, pigments or the like. For rigid printed circuit applications, epoxy-fiber glass and epoxy-paper laminates are preferred. For other electronic and decorative uses, the substrate is specified individually. Representative decorative uses, for example, include designs, printed patterns or labeling of glass, paper, treated paper or plastic containers or other substrates such as flat glass or plastic substrates can be produced in accordance with this invention.

It may be necessary to pre-treat the substrate in order to improve adhesion such as with polyolefins by treatment with plasma or corona discharge in order to increase critical surface tension. Chemical treatment through the use of a tie coat is also known in the art, for example, the use of an adhesive layer on Mylar ® brand polyester or Kapton ® brand polyimide to improve the adhesion of subsequent coated or laminated layers. Any means well known in the art is applicable to this invention.

The printed coating can be applied to the substrate by a variety of means either in solution, dispersion or neat. When applied as a liquid, either in solution, dispersion or neat, the method of application can be silk screening, flexography, letter set, letter press, offset printing, rotogravure, hot stamping, transfer printing or drawing by hand or the like. When applied as dry resin, such as a powder, the application methods can include spraying, sputtering or dusting or the like. The dry resin can be applied as a pattern by use of a patterned adhesive or by electrostatic printing or the like.

The printed coating can be dried or cured by either heat or radiation. It is preferred to utilize a curable 100% reactive resin composition which is curable at room temperature by radiation such as ultraviolet radiation, electron beam, X-ray or the like so that curing can be effected without adversely thermally degrading a wide variety of substrates, and solvent evaporation is not an environmental problem. Another preferred means for curing the printed resin is anaerobic curing such as with cyanoacrylated resins.

The requirements for the printed cured resin vary with end-use requirements. For printed circuit boards, the resin must be resistant to water, humidity and solvents, must have physical and electrical stability over a wide temperature range, and a coefficient of thermal expansion similar to the substrate to which it is applied. The coating should also be solderable once metal plated. The adhesion of the printed resin to the substrate must be excellent; and on flexcircuits, it must be flexible. For decorative uses, the printed resin must be adherent to the substrate and flex if the substrate is flexible; other specifications apply for specific cases. In all cases, it is necessary that the printed resin coating be capable of permanently binding to the substrate, forms a base for absorbing activating catalytic metal and includes at least a portion of the composition which is removable in order to render its surface non-smooth so that subsequently plated metal can be anchored thereto. Both thermosetting resins and thermoplastic resins are suitable. Representative examples of thermosetting resins are epoxies and urea-formaldehyde based resins. Representative examples of thermoplastic resins are acrylics, urethanes, polyamides, polyimides, siloxanes, polyacrylamides, polyvinylacetate-alcohol, polyacrylonitrile, polybutadiene and polyisoprene. Any combination of the representative polyblends, copolymers and composite examples are suitable. Typical 100% reactive resin compositions for radiation induced free radical polymerization are composed of photoinitiators; photoreactive prepolymers, such as acrylated urethanes; monomers, such as 2-ethylhexyl acrylate; and multifunctional monomers, such as pentaerythritol triacrylate. Typical 100% reactive resin compositions for radiation induced ionic polymerizations are composed of photoinitiators; di- or multi-functional epoxides, such as the diglycidyl ether of Bisphenol A; and in some cases difunctional active hydrogen compounds such as diamines, diacids, diols and anhydrides. Alternatively, polymers can be blended into monomer/prepolymer mixtures to provide increased viscosity and/or phases for subsequent etching.

After printing the resin in a pattern and curing by either thermal or radiation means, the resin is etched to provide attraction sites for subsequent catalytic metal deposition and to provide microvoids for increased adhesion of the metal plate. Etching involves solvating one phase of the resin with a solvent to form microvoids and chemically modifying the remaining resin to provide attraction sites for catalytic metal deposition. Traditionally chromic acid is used for etching materials such as plastics, particularly in systems containing butadiene, such as acrylonitrile-butadiene-styrene (ABS) plastics. For the present invention, a wide variety of etchants are satisfactory as long as selective solvation and chemical modification occurs. Sulfuric acid is the preferred embodiment for one preferred system and $N(CH_3)_4OH$ is preferred with another resin system. Subsequent to etching, the resin must be activated by absorption of catalytic metal into and onto the resin. Typically, palladium-tin combination baths are used for plating on plastics. The preferred method for this invention is the use of a non-noble metal catalyst system using nickel and copper, or nickel alone. The requirement for this catalytic metal is that it permits and aids in the deposition of a metal onto the resin by electroless plating. Once the catalytic metal has been deposited on the resin surface, further treatment such as oxidation using a citric acid wash for Pd/Sn baths or reduction using sodium borohydride, amine boranes, hydrazines or aldehydes for Cu/Ni baths may be required. This post-treatment can be necessary to reduce the catalytic metal to the zero valence state and hence render it catalytic towards electroless plating. After activating baths, thorough rinsing is conducted to ensure the removal of excess, loose catalytic metal either on the printed coating or on the substrate. Excess, loose catalytic metal lying on the pattern can cause lack of electroless metal adhesion, or loose catalytic metal on the substrate can cause lack of selectivity of the subsequent metal plate or loose catalytic metal can be carried forward into the subsequent metal electroless plating bath and cause poisoning. Any electroless metal plating bath is suitable for this application; that is, a process which separates metal out of a solution of metallic salt where there are no outside sources of current, therefore, the necessary electrons in the solution are produced by a chemical process rather than electrolytically. Representative metals that can be applied in this manner are copper, nickel, gold, silver, tin, lead, palladium and platinum. Copper is preferred as it is conductive, ductile and relatively inexpensive. The metal to be plated can be varied however depending on the desired conductivity or resistivity. In the same circuit pattern, for instance, it may be desired to incorporate selected areas of resistance by plating with silver/palladium or other metals in various thicknesses and widths, in addition to plating selected areas for conduction with copper or nickel. The primary requirements for printed circuit boards are adhesion to the printed cured resin, flexibility to match the substrate, conductivity, abrasion resistance and resistance to humidity and temperature. For decorative pieces, the primary requirements would be adhesion to the printed resin, flexibility to match the substrate and abrasion resistance.

Subsequent to electroless deposition of metal, additional layers of metal can be deposited on all or a portion of the electrolessly deposited metal. For example, the substrate printed with electrolessly deposited metal can be dipped in molten metal or it can be treated in an electroless or electrolytic bath of the same or a different metal depending on the end-use requirements. Representative suitable additional metal layers can comprise copper, nickel, silver, gold, tin, tin-lead or the like. The preferred embodiment in this case is a follow-up with a copper or nickel electrolytic bath. The electroless and electrolytic baths may employ any known-to-the-art chemical constituents and may employ any technique known to the art, such as baths or brush plating.

In one aspect of this invention, multilayers of metals can be applied to a common substrate with dielectric layers being interposed between adjacent metal layers in order to form three dimensional electro-conducting paths on a given substrate. This can be done by forming a second patterned layer of a curable resin in the manner described above with suitable holes in each subsequently applied resin layer in order to expose only a portion of the first applied metal layer to subsequent metal layers. Thereafter, each subsequently applied resin layer is activated in the manner described above so as to form a metal layer on the newly applied cured, activated resin and to coat the interior of the holes within the resin so that metal layers can be connected with adjacent metal layers by a metal coating on the interior walls of the hole in the intermediate cured resin layer.

As stated above, the electrolessly applied metal layer can, in turn, be coated with one or more additional metal layers either electrolessly or electrolytically. In a preferred form of this invention, an electrolytically applied layer of metal is deposited on the metal layer. It has been found that in many instances, the electrolytically applied layer is more uniform and less likely to contain voids. Copper, electrolytically applied, comprises a particularly useful embodiment.

Components such as coils and capacitors can be integrated into the conducting patterns, by using the base as the dielectric of the capacitor and conductive patterns opposite each other. A coil can be made as a flat coil with the conductive windings on one side of the base or by connecting half windings on both sides of the base with through holes.

Figure 1:
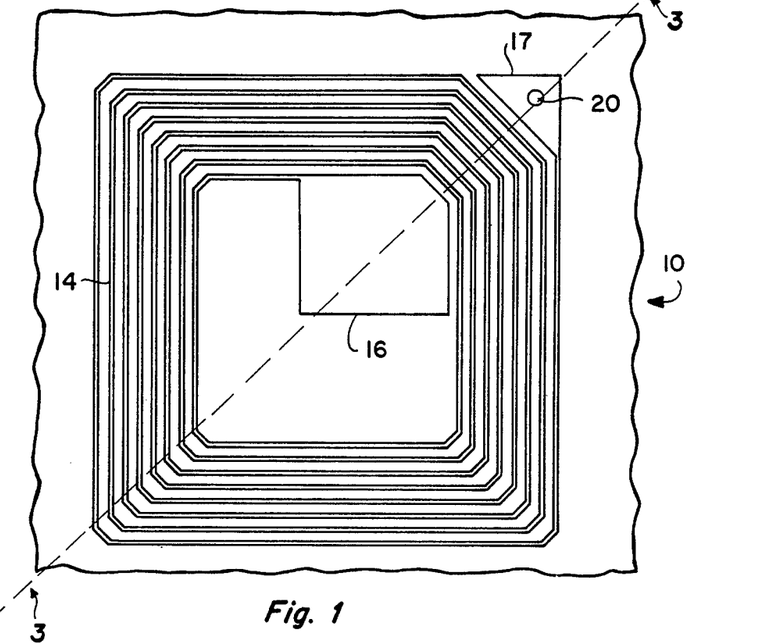
FIG. 1 is a top view of a resonant tag electronic article surveillance (EAS) circuit made in accordance with this invention.
Figure 2:
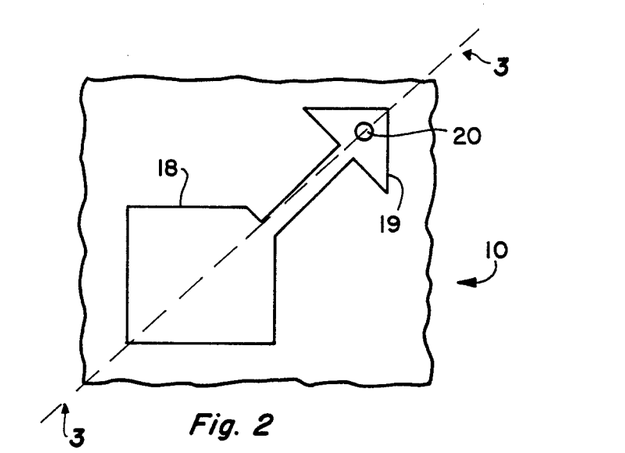
FIG. 2 is a bottom view of a resonant tag circuit made in accordance with this invention.
Figure 3:
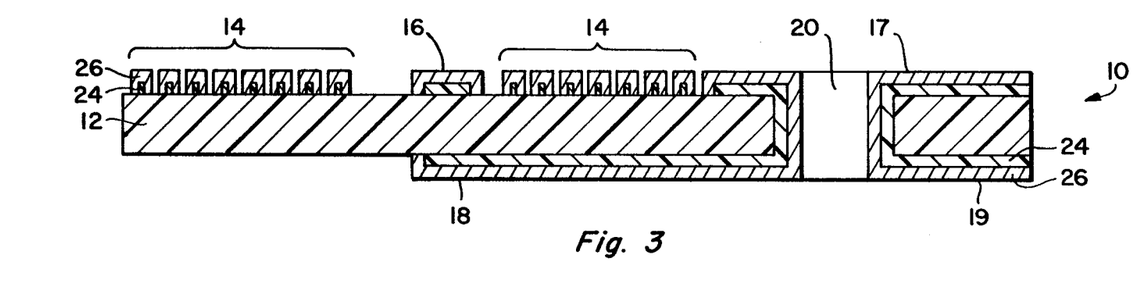
FIG. 3 is a cross-sectional view of the circuit of FIGS. 1 and 2 along line 3—3.

Referring to FIGS. 1 through 3, the resonant circuit 10 is shown. An inductor 14 is electrically connected at respective ends to conductive areas 16 and 17. Conductive area 17, in turn, is electrically connected through hole 20 to conductive areas 19 and 18 (FIG. 2). An insulative layer 12, is interposed between conductor 16 and 18. Each portion of the inductor 14 and the conductive areas 16, 17, 18 and 19 comprise a layer of cured resin 24 and a layer of a plated metal 26. Conductors 16 and 18 are aligned so as to define respective plates of a capacitor. A fusable link can be included in a portion of the inductor path 14, such that the tag can be electrically deactivated. For example, a thin high resistance portion can be included within inductor path 14.

The tag shown in FIGS. 1-3 has a self-contained operative tuned circuit with integrally formed circuit elements including an inductor and a capacitor. In one form, an insulative substrate material of predetermined thickness and dielectric characteristics is provided, having first and second faces and a conductive surface on the first face. Printed on the conductive surface is a first repetitive circuit pattern defining a first conductive area serving as a first plate of the capacitor, and an inductor electrically connected at a first end thereof to the first conductive area.

The tag produced thus comprises a planar substrate of electrically insulative material, with a conductive surface pattern on a first face thereof defining an inductor and a first conductive area electrically connected to a first end of the inductor. A pattern of conductive material applied to a second face of the substrate defines a second conductive area in at least partial alignment with the first conductive area, and a conductive strip effecting electrical connection between the second conductive area and a second end of the inductor. The conductive areas serve as capacitor plates, each of which is connected to one end of the inductor to form a resonant loop.

In a second form of the tag, the substrate and circuit pattern are folded such that the first and second conductive areas are at least in part mutually aligned to form respective plates of the capacitor. The web and circuit pattern may be folded such that a double layer of the insulative substrate web forms a dielectric of the capacitor, or may be folded such that the conductive areas of the circuit pattern face each other, in which case a layer of insulative material may be inserted between the conductive areas to form the capacitor dielectric. The inserted layer of insulative material may be an edge portion of the substrate web. The folded web and circuit pattern is then sealed at least in a region over which the first and second conductive areas are mutually aligned, thereby fixing the capacitance of the capacitor. The web is separated between adjacent repetitive circuit patterns to provide individual planar resonant tags.

The resonant frequencies of the tags can be monitored and the tags may be "tuned" by adjusting the plate area of one of the two plates of the capacitor subsequent to the initial fabrication process and/or by modifying the thickness of the dielectric layer between the plates of the capacitor with application of heat and pressure.

Figure 4:
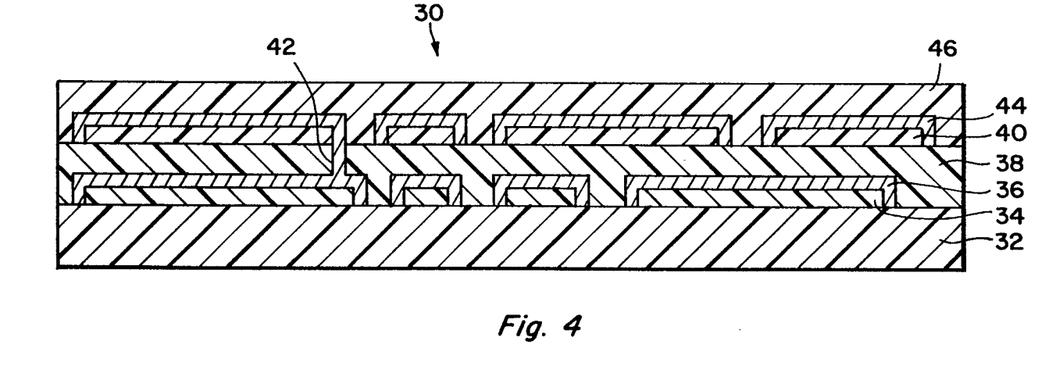
FIG. 4 is a cross-sectional view of a multilayer circuit made in accordance with this invention.

Referring to FIG. 4, a composite article 30 having a plurality of metal layers is shown from a cross-sectional view. The composite article 30 includes a base 32 which can be made of a rigid composite or flexible composition. A plated metal layer 36 is bonded to the cured printed resin layer 34. A dielectric layer 38 is applied to insulate metal layer 36 and substrate 32 and is provided with a hole 42 which can be made in any convenient manner such as by positioning a pin (not shown) on layer 36 during application of layer 38 or with printing techniques. A second cured resin 40 containing an activator is selectively applied to layer 38 and is also provided with a hole 42 which can be made in any convenient manner. A second electrolessly applied metal layer 44 then is deposited on layer 40. Layer 44 is connected to layer 36 through hole 42. A cured resin layer 46 then can be applied to layer 44, if desired.

Figure 5:
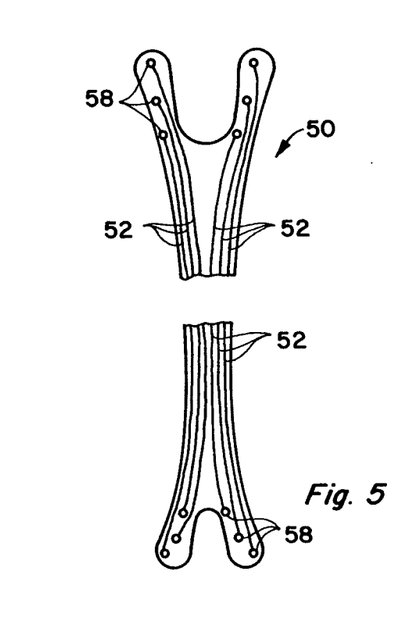
FIG. 5 is a top view of a flexible circuit made in accordance with this invention.
Figure 6:
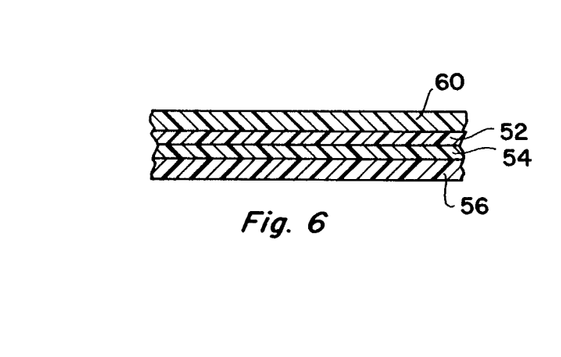
FIG. 6 is a cross-sectional view of the flexible circuit of this invention.

Referring to FIGS. 5 and 6, a flexible circuit 50 is shown which comprises a plurality of conductive metal paths 52 electrolessly deposited on a cured printed resin layer 54 which, in turn, is bonded to the flexible polymer base 56. The conductive paths 52 are connected to metal connectors 58 so that the circuit 50 can be connected to additional circuits or electrical apparatus (not shown). A polymer layer 60 is applied to coat the metal paths 52 and to be bonded to base 56. The layer 60 can be applied by any conventional means such as with adhesive, hot melt bonding or the like.

Figure 7:
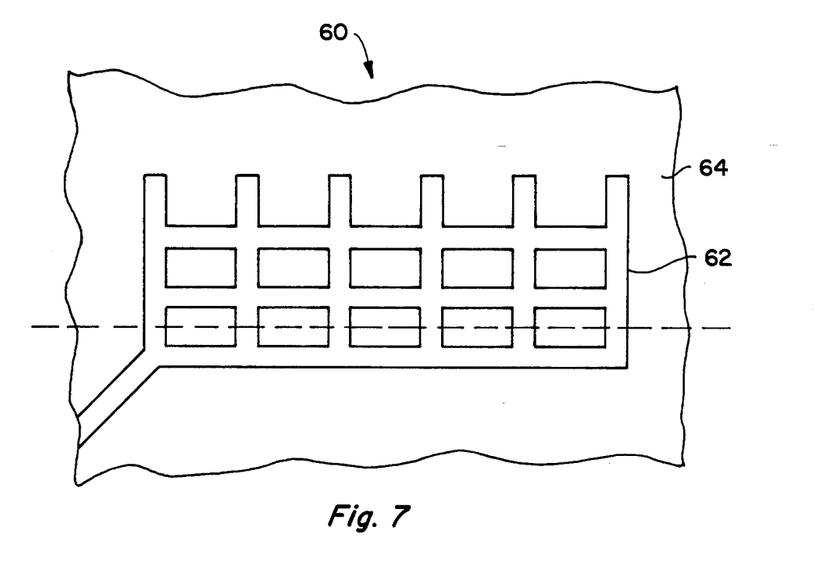
FIG. 7 is a top view of a touch circuit mode in accordance with this invention.
Figure 8:
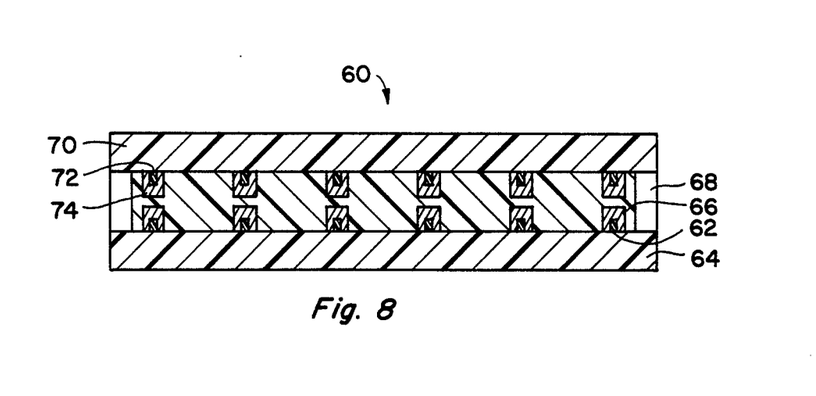
FIG. 8 is a cross-sectional view of the touch circuit taken at line 8—8 of FIG. 7.

Referring to FIGS. 7 and 8, a touch sensitive membrane switch 60 is shown which comprises a plurality of conductive metal paths 66 plated on a cured printed resin layer 62 which, in turn, is bonded to the lower flexible polymer substrate 64. A layer of metal 66 is plated onto printed resin layer 62. A spacer layer of flexible film, such as polyester, 68 is utilized to provide a touch sensitive area. To upper flexible polymer substrate 70 is bonded printed resin layer 72 which is then plated with metal 74. Metal layer 66 and metal layer 74 are in related positions to each other so that pressure from either top or bottom will provide intimate contact, thus completing a circuit during the period of pressure contact.

The following examples illustrate the present invention and are not intended to limit the same.

EXAMPLE I

This example illustrates making a single sided flexible circuit pattern.

A 0.70 mil thick polypropylene film, previously corona treated is printed on the treated side with an ultraviolet radiation curable 100% solids epoxy based composition comprising 20 wt % polyglycidylether of phenol-formaldehyde novolac, 20 wt % cycloaliphatic diepoxide, 10 wt % diglycidyl ether of polypropylene glycol, 50 wt % $SiO_2$ and a cationic photoinitiator, such as triphenyl sulfonium hexafluoro-antimoniate. The resin is applied in a printed pattern as an electrical circuit by silk screening using a 390 mesh polyester screen.

The printed film is exposed to a 200 watts/in mercury vapor discharge lamp (American Ultraviolet Portacure 1500), having a maximum intensity wavelength range from 200–400 nm for 30 seconds at a lamp to substrate distance of 5 inches. At this time, the printed coating is completely cured as evaluated by lack of tack, scratch resistance, and lack of solubility.

The printed pattern is rendered susceptible to plating by etching and activating steps. Etching is accomplished by immersion of the printed pattern in a concentrated (96 wt %) $H_2SO_4$ bath at 55° C. for 45 seconds. After etching, the pattern is rinsed thoroughly with water and immersed in an activator bath containing 0.1 m $CuSO_4.5H_2O$, 0.1 m $NiSO_4.6H_2O$, 0.1 m citric acid, 0.33 m sorbitol adjusted to pH 4.2 with NaOH. The pattern is immersed in the above bath for 5 seconds at room temperature. The pattern is rinsed and immersed in a 3 wt % sodium borohydride bath at pH 10.4 for 15 seconds. After thorough rinsing with water, the pattern is ready for copper plating. An electroless copper bath comprising 0.03 m copper sulfate, 0.08 m formaldehyde, 0.125 m sodium hydroxide, 0.036 m ethylene diamine tetraacetic acid, sodium salt, $4 \times 10^{-4}$ m sodium cyanide and deionized water is employed to selectively plate copper onto the printed pattern. The printed pattern is immersed for 15 minutes or longer with the bath temperature at 55° C. to form the electrolessly-applied layer of copper. After rinsing, the circuit can be electrolytically plated for 20 minutes at 2-4 amps/dm² in a plating bath containing 0.4 m copper sulfate, 1.12 m ethylene diamine, 0.142 m ammonium sulfate, 0.2 m sulfuric acid and deionized water.

The above procedure has been followed on various thicknesses (0.2 to 2 mil) of polypropylene film and on 2 mil polyethylene film. In addition, commercial electroless plating baths, CP-78 from Shipley Company, and Macuplex 7920 from McDermid, Inc. can be utilized for electroless plating of the etched and activated printed coating.

EXAMPLE II

This example illustrates making a double sided flexible passive circuit pattern, an electronic article surveillance tag.

A 0.70 mil thick polypropylene film, previously corona treated on two sides and containing a punched thru-hole, is printed on each side individually with the ultraviolet radiation curable, 100% solids epoxy based composition as set forth in Example I. The resin is applied in a printed pattern as a resonant electrical circuit containing a thru-hole which is coated during the printing step. A 390 mesh polyester silk screen is used for printing.

Each side of the printed film is exposed and cured as in Example I.

The printed tag is etched, activated, and plated as in Example I. Once plated, the conductive tag is dried, laminated and cut to form the final product. The tag has a resonant frequency of 8.0 mHz.

EXAMPLE III

This example illustrates making a single sided flexible printed circuit.

A 4.5 mil thick polyester film is printed in the circuit pattern by silk screening with an ultraviolet radiation curable 100% solids coating composition comprising 50 wt % polyurethane diacrylate, 20 wt % maleic anhydride, 15 wt % n-vinyl pyrrolidone, 15 wt % trimethylol propane triacrylate, and a free radical photoinitiator such as 2,2-dimethoxy-2-phenyl acetophenone (DEAP).

The printed substrate is exposed to ultraviolet radiation having a wavelength of 200–400 nm from a 200 watts/in mercury vapor discharge lamp for 30 seconds at a distance of 5 inches. At this time, the printed coating is completely cured as evaluated by lack of tack, scratch resistance and lack of solubility.

The printed pattern is rendered susceptible to plating by etching and activating steps. Etching is accomplished by immersion of the pattern in a 2.5 wt % aqueous tetramethylammonium hydroxide solution at room temperature for 10 minutes. After etching, the pattern is rinsed thoroughly with water and immersed in an activator bath containing 0.1 m $CuSO_4.5H_2O$, 0.1 m $NiSO_4.6H_2O$, 0.1 m citric acid, 0.33 m sorbitol adjusted to pH 4.2 with NaOH. The pattern is immersed in the above bath for 1 minute at room temperature. The pattern is rinsed and immersed in a 3 wt % sodium borohydride bath at pH 10.4 for 30 seconds. After thorough rinsing with water, the pattern is ready for copper plating. The activated printed pattern is plated as in Example I.

The above procedure can also be utilized on other substrates such as polyethylene film, polypropylene film, polyimide film, polycarbonate film, polyetherimide film or polysulfone film.

EXAMPLE IV

This example illustrates making a double sided flexible printed circuit.

A 0.75 mil thick polypropylene film, previously corona treated on two sides, and containing a punched thru-hole, is printed by silk screening on each side individually with the ultraviolet radiation curable composition of Example III. A 390 mesh polyester silk screen is used.

Each side of the film is exposed and cured as in Example III.

The double sided printed circuit is etched, activated and plated as in Example III. Once plated, the conductive pattern is ready for further fabrication to form a completed flex circuit.

EXAMPLE V

This example illustrates making a multilayer circuit.

A 0.75 mil thick composite polypropylene film consisting of a polypropylene inner layer and surface coated on two sides with a polyethylene/propylene resin and corona treated on two sides and containing a punched thru-hole, is printed by silk screening on each side individually with the ultraviolet radiation curable composition of Example I.

The printed film is exposed, cured, etched, activated and plated as in Example II.

After drying, the conductive double sided circuit is then heat laminated on each side with the above-treated composite polypropylene film containing a punched thru-hole. A second circuit pattern is printed by silk screening on each side individually of the double sided circuit with the ultraviolet radiation curable composition of Example I.

The printed second layer of the multilayer circuit is exposed, cured, etched, activated and plated as in Example II. At this point, four layers of conductive circuitry are formed.

This procedure may be repeated as necessary to increase the number of layers for a desired final multilayer circuit.

Using the ultraviolet radiation curable composition and procedure of Example III, other substrates can be utilized such as polyester, polyimide, polycarbonate, polyetherimide or polysulfone utilizing other lamination means such as solvents or adhesives. Rigid substrates such as epoxy-fiber glass and phenolic-fiber glass laminates can also be utilized; any combination of flexible and rigid substrates are suitable for the fabrication of multilayer circuits using the process of this invention and appropriate laminating means.

EXAMPLE VI

This example illustrates making a single sided rigid printed circuit board.

A 56 mil thick epoxy-fiber glass board is printed with the ultraviolet radiation curable composition of Example III. The printed board is exposed, cured, etched, activated and plated as in Example III.

The above procedure can also be utilized on other rigid substrates such as urea formaldehyde-fiber glass and phenolic-fiber glass laminates.

In addition, touch sensitive switches such as in keyboard and membrane circuits can be fabricated using the ultraviolet radiation curable composition and procedure of Example III utilizing substrates such as polyolefins, polyesters, polyimides, polycarbonates, polyetherimides or polysulfones.

We claim:

1. The process for forming a composite product which comprises applying directly to a base a patterned layer of curable resin, curing said resin in said pattern, etching said patterned cured resin in the absence of a mask with an etchant which will permit absorption onto said patterned cured resin of a metal catalyst capable of promoting electroless metal deposition selectively but which will not chemically modify said base so as to permit absorption onto said base of a metal catalyst capable of promoting electroless metal deposition selectively, contacting said etched cured resin with a catalyst composition capable of promoting electroless metal deposition on said etched cured resin without effecting, absorption of said catalyst on said base, activating the absorbed catalyst, and electrolessly depositing a metal layer on said etched cured patterned resin selectively without effecting electroless deposition of said metal layer on the base.

2. The process of claim 1 wherein said base is a flexible substrate.

3. The process of claim 1 wherein said base is a rigid substrate.

4. The process of claim 1 wherein said metal layer is copper.

5. The process of claim 1 wherein said catalyst composition comprises copper and nickel.

6. The process of claim 1 wherein said catalyst composition comprises copper and nickel boride.

7. The process of claim 1 wherein said catalyst composition comprises nickel boride.

8. The process of claim 1 wherein said catalyst composition comprises palladium and tin.

9. The process of claim 1 wherein said curing is effected with electron beam radiation.

10. The process of claim 1 wherein said curing is effected thermally.

11. The process of claim 1 wherein said curing is effected with ultraviolet radiation.

12. The process of claim 1 wherein said curing is effected with ultraviolet radiation and wherein said metal layer is copper.

13. The process of claim 1 wherein said base comprises a polyimide composition.

14. The process of claim 1 wherein said base comprises a polyester composition.

15. The process of claim 1 wherein said base comprises a polyolefin composition.

16. The process of claim 1 wherein said base comprises a polycarbonate composition.

17. The process of claim 1 wherein said base comprises a polyetherimide composition.

18. The process of claim 1 wherein said substrate comprises a composite of a resin and a reinforcing component.

19. The process of claim 1 wherein the reinforcing component is fiber glass.

20. The process of claim 1 wherein said substrate comprises a composite or resin and paper.

21. The process of claim 1 wherein said substrate comprises a composite of an epoxy resin and fiber glass.

22. The process of claim 1 wherein said substrate comprises a composite of an epoxy resin and paper.

23. The process of claim 1 wherein said patterned cured resin composition comprises an epoxy containing resin composition.

24. The process of claim 1 wherein said patterned cured resin composition comprises an acrylic containing resin composition.

25. The process of claim 1 wherein said patterned cured resin composition comprises a polyimide containing resin composition.

26. The process of claim 1 wherein said patterned cured resin composition comprises an unsaturated polyolefin containing resin composition.

27. The process of claim 1 wherein a second metal layer is bonded to said metal layer bonded to the cured resin.

28. The process of claim 1 wherein a second metal layer is electrolytically applied to said electroless metal layer.

29. The process of claim 1 wherein a second metal layer comprising copper is applied to said electroless metal layer.

* * * * *